US008271924B1

(12) United States Patent
Orthner et al.

(10) Patent No.: US 8,271,924 B1
(45) Date of Patent: Sep. 18, 2012

(54) SELF-CONFIGURING COMPONENTS ON A DEVICE

(75) Inventors: Kent Orthner, Kanata (CA); Desmond Ambrose, Ottawa (CA); Geoff Barnes, Carleton Place (CA)

(73) Assignee: Altera Corporation, San Jose, CA (US)

( * ) Notice: Subject to any disclaimer, the term of this patent is extended or adjusted under 35 U.S.C. 154(b) by 536 days.

(21) Appl. No.: 12/426,895

(22) Filed: Apr. 20, 2009

Related U.S. Application Data

(63) Continuation of application No. 11/418,693, filed on May 5, 2006, now Pat. No. 7,539,967.

(51) Int. Cl.
*G06F 17/50* (2006.01)
*G06F 15/177* (2006.01)
*G06F 9/00* (2006.01)

(52) U.S. Cl. ........... 716/117; 716/104; 716/128; 713/2; 713/100; 703/16

(58) Field of Classification Search .................. 716/117, 716/104, 128; 703/2, 100, 16; 713/2, 100
See application file for complete search history.

(56) References Cited

U.S. PATENT DOCUMENTS

| | | | |
|---|---|---|---|
| 4,870,302 A | 9/1989 | Freeman | |
| 5,031,111 A * | 7/1991 | Chao et al. ..................... 716/112 |
| 5,257,350 A * | 10/1993 | Howard et al. ............... 345/501 |
| 5,838,165 A | 11/1998 | Chatter | |
| 5,923,614 A | 7/1999 | Erickson et al. | |
| 6,222,381 B1 | 4/2001 | Durbeck et al. | |
| 6,260,139 B1 | 7/2001 | Alfke | |
| 6,297,667 B1 | 10/2001 | Macias | |
| 6,326,806 B1 | 12/2001 | Fallside et al. | |
| 6,389,078 B1 * | 5/2002 | Hessel et al. .................. 375/259 |
| 6,601,218 B2 | 7/2003 | Sato et al. | |
| 6,609,195 B2 | 8/2003 | Dover | |
| 6,748,456 B1 | 6/2004 | Stanton et al. | |
| 6,874,107 B2 | 3/2005 | Lesea | |
| 7,028,107 B2 | 4/2006 | Vorbach et al. | |
| 7,199,608 B1 | 4/2007 | Trimberger | |
| 7,227,378 B2 | 6/2007 | Blodget et al. | |
| 7,328,335 B1 | 2/2008 | Sundararajan et al. | |
| 7,358,762 B1 | 4/2008 | Walstrum et al. | |
| 7,865,344 B2 * | 1/2011 | Wozniak ......................... 703/13 |
| 7,886,255 B2 * | 2/2011 | Simar et al. .................... 716/104 |
| 7,949,342 B2 * | 5/2011 | Cuffaro et al. ............. 455/452.2 |
| 2003/0009730 A1 * | 1/2003 | Chen et al. ......................... 716/5 |
| 2003/0033514 A1 | 2/2003 | Appleby-Allis et al. | |
| 2003/0126422 A1 | 7/2003 | Dover | |
| 2004/0111590 A1 | 6/2004 | Klein, Jr. | |
| 2004/0117755 A1 | 6/2004 | Blodget et al. | |
| 2004/0152954 A1 * | 8/2004 | Pearce et al. .................. 600/300 |
| 2005/0149893 A1 * | 7/2005 | Roesner et al. ................... 716/4 |

(Continued)

OTHER PUBLICATIONS

John Williams and Neil Bergmann, "Embedded Linux as a Platform for Dynamically Self-Reconfiguring Systems-on-Chip", downloaded from Linuxdevices.com, Jul. 14, 2005 (downloaded Apr. 18, 2007), (Continued)

*Primary Examiner* — Phallaka Kik
(74) *Attorney, Agent, or Firm* — Kwan & Olynick LLP

(57) ABSTRACT

Methods and apparatus are provided for allowing components such as buffers, multiplexers, ingress cores, etc. on a device such as a programmable chip to configure themselves based on parameter information. In some examples, self-configuring components obtain parameter information from adjacent components. In other examples, self-configuring components obtain parameter information from a system environment or a processor register. Component self-configuration can occur at a variety of times including preprocessing, simulation, and run-time.

17 Claims, 8 Drawing Sheets

U.S. PATENT DOCUMENTS

| | | | |
|---|---|---|---|
| 2005/0183045 A1* | 8/2005 | Hwang et al. | 716/1 |
| 2005/0193358 A1 | 9/2005 | Blodget et al. | |
| 2005/0223384 A1 | 10/2005 | Klingman | |
| 2006/0038586 A1 | 2/2006 | Xia et al. | |
| 2006/0242616 A1* | 10/2006 | Iotov | 716/17 |
| 2007/0160158 A1* | 7/2007 | Zeng et al. | 375/260 |
| 2007/0200594 A1 | 8/2007 | Levi et al. | |
| 2008/0143378 A1 | 6/2008 | Xia et al. | |

OTHER PUBLICATIONS

Koster et al., "(Self-)Reconfigurable Finite State Machines: Theory and Implementation", 2002 Proceedings of Design, Automation and Test in Europe Conference and Exhibition, 2002, pp. 559-566.

Meng, "An Agent-Based Reconfigurable System-on-Chip Architecture for Real-Time Systems", 2005 Second International Conference on Embedded Software and Systems, Dec. 16-18, 2005, 8 pages.

* cited by examiner

SELF-CONFIGURING COMPONENTS ON A DEVICE

CROSS REFERENCE TO RELATED APPLICATIONS

This application is a continuation of and claims benefit of priority under 35 U.S.C. 120 of U.S. patent application Ser. No. 11/418,693, filed May 5, 2006 now U.S. Pat. No. 7,539,967 and titled "SELF-CONFIGURING COMPONENTS ON A DEVICE", the entirety of the application is incorporated by reference for all purposes.

BACKGROUND OF THE INVENTION

1. Field of the Invention

The present invention relates to self-configuring components. In one example, the present invention relates to methods and apparatus for providing a component on a device that obtains parameter information and performs self-configuration.

2. Description of Related Art

Electronic devices such as programmable chips often include a variety of components. The components typically have to be selected and configured to comply with a particular set of parameters. For example, the components may have to be configured to comply with a specific set of signals and comply with a particular set of timing requirements associated with the signals in order for components to operate with other components on a device.

Designers are forced to configure various components to support the same parameters, such as data width and burst size. The configuration is carried out either manually or by using specialized software tools such as System On A Programmable Chip Builder (SOPC Builder) available from Altera Corporation of San Jose, Calif. The configuration process is typically labor intensive and error-prone, as many components have interfaces with dozens of parameters.

Techniques and mechanisms for configuring components have significant limitations. Consequently, it is desirable to provide improved methods and apparatus for allowing configuration of components.

SUMMARY OF THE INVENTION

Methods and apparatus are provided for allowing components such as buffers, multiplexers, ingress cores, etc. on a device such as a programmable chip to configure themselves based on parameter information. In some examples, self-configuring components obtain parameter information from adjacent components. In other examples, self-configuring components obtain parameter information from a system environment or a processor register. Component self-configuration can occur at a variety of times including preprocessing, simulation, and run-time.

In one embodiment, a programmable chip is provided. The programmable chip includes a first component and a second component. The first component includes a first component output interface and the first component is associated with parameter information. A second component includes a second component input interface. The second component includes logic operable to obtain parameter information and perform self-configuration of the second component input interface using the parameter information so that the second component is interoperable with the first component.

The second component can also include a second component output interface. The second component includes logic that is further operable to perform self-configuration of the second component output interface.

In another embodiment, a technique for a component on a device to obtain parameter information is provided. A query is transmitted on a line associated with a first component to obtain parameter information. The first component and a second component on an electronic device are connected. Logic operable to obtain parameter information is included in the first component. Self-configuration is performed at the first component using parameter information and the first component is operable to interact with the second component after self-configuration is performed.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
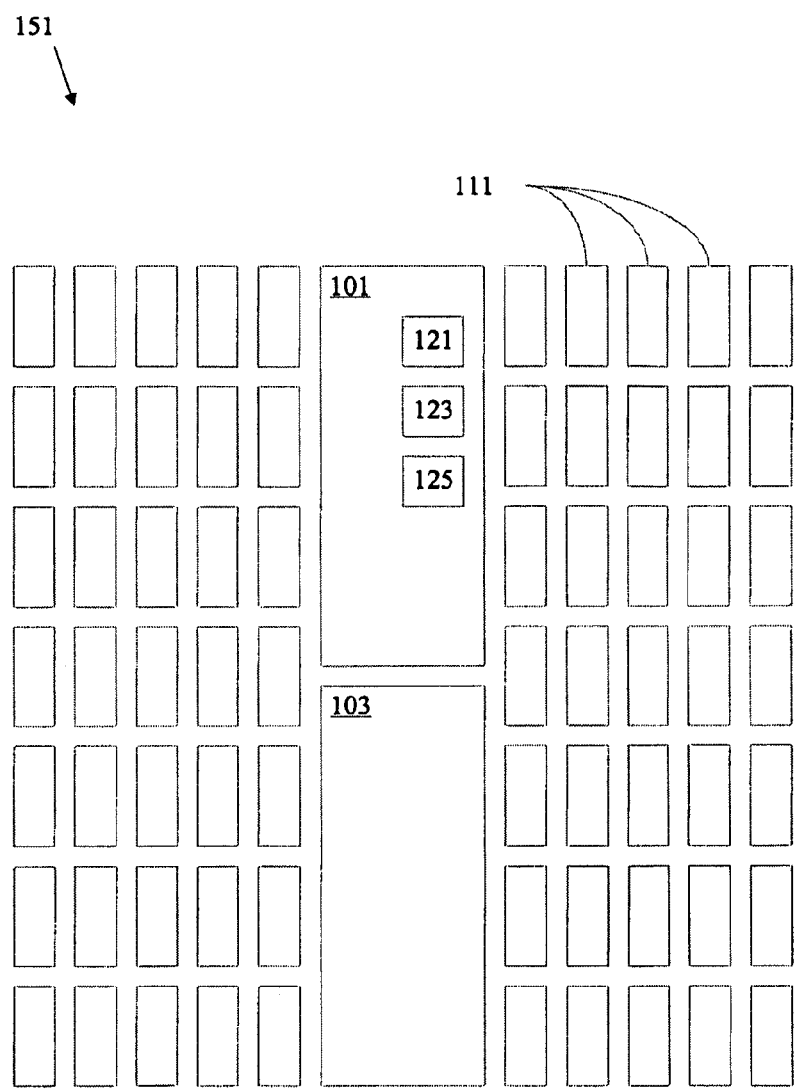
FIG. 1 is a diagrammatic representation of a programmable chip.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of programmable chips. However, it should be noted that the techniques of the present invention can be applied to a variety of devices. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted.

In order for components to effectively communicate on a device such as a programmable chip, the components have to be configured so that they are compatible with connected components. A designer typically has to be aware of how each component is expected to behave and has to individually configure each component so that they can reliably interact. When done manually, this requires that the designer read documentation on the component, decide how parameters should be set, and then set those parameters when the component is instantiated. Parameters typically take the form of verilog "parameters" or VHDL "generics." A more effective technique is to generate a component using a tool such as SOPC Builder.

When components are configured using software tools, many details are hidden from a designer. The tools have to use control files such as XML files to obtain information about the components and then configure the components for particular uses. The tools have built-in knowledge of how the blocks must interact and maintain a central store for this information. When decisions are made, the tool will configure components using Verilog "parameters" or VHDL "generics" or through script preprocessing to get the desired operation. The tool then has to maintain and manage the appropriate design files.

Manually configuring components has a number of drawbacks. Manual configuration is tedious and time consuming. Designers have to understand every detail of a component before instantiating and then hardcode the desired values in a hardware description language (HDL). Errors are common. Manual configuration also lacks flexibility. If one aspect of a component changes, other components connected to that changed component have to be altered.

Software configuration of components also has a number of drawbacks. When components are changed, software tools can recognize a change but software generation processes have to be run again in order to make changes to the appropriate components. For components to be integrated into a tool, control files have to be written to communicate configuration information. Errors are also still common as designers have to input information through a user interface.

According to various embodiments, self-configuration capabilities are provided with a component. In one embodiment, parameter information is encapsulated in HDL of IP blocks and subblocks themselves. Parameter information can then be exported and imported to/from adjacent blocks or system environments to allow self-configuration. Any information used to configure a component is referred to herein as parameter information. Parameter information can include information used for datapath adaptation, compatible protocol selection, or any information one component requires from another component about behavior, features, or interface. Transfer of configuration information can take place over input and output lines between blocks or components. In some embodiments, synthesis optimization of netlist ensures that unused logic or unused features are optimized away through propagation of constants.

FIG. 1 is a diagrammatic representation showing one example of a programmable chip that can use the techniques of the present invention. Although a particular programmable chip is described, it should be noted that the techniques of the present invention can be implemented using a variety of devices. Any device such as a Field Programmable Gate Array (FPGA) or a Programmable Logic Device (PLD) that is configurable using a hardware descriptor language (HDL) such as Verilog or VHDL is referred to herein as a programmable chip. A programmable chip 151 can also include hard coded logic blocks 101 and 103. In some examples, the hard coded logic blocks 101 and 103 are DSP blocks that can efficiently implement multiplication, multiply-accumulate (MAC) and multiply-add functions. In one example, the hard coded logic block 101 includes a multiplier 121, an adder 123, and an accumulator 125. The multipliers can be configured to feed an adder or an accumulator.

According to various embodiments, the DSP block 101 also has input registers that can be configured to operate in a shift register chain for efficient implementation of functions like FIR filters. The programmable chip also includes logic array blocks (LABs), logic cells, or logic elements 111. The programmable chip uses different types of resources that can be interchangeably used in different allocations to implement a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

The programmable chip 151 can also include other components such as a hard coded processor or memory. Alternatively, logic elements can also be used to implement soft processors as well as other components such as hardware accelerators, peripheral devices, and peripheral interfaces. Peripheral devices and peripheral interfaces are herein referred to as components. In some embodiments, a system on a programmable chip can be implemented on the programmable chip 151. The programmable chip system components are connected using one or more interconnection fabrics. Any mechanism or logic for connecting components in a system is referred to herein as an interconnection fabric. In one example, the interconnection fabric is a bus. In another example, the interconnection fabric is a fabric that actively selects interface adapters to allow components with incompatible data interfaces to connect.

Figure 2:
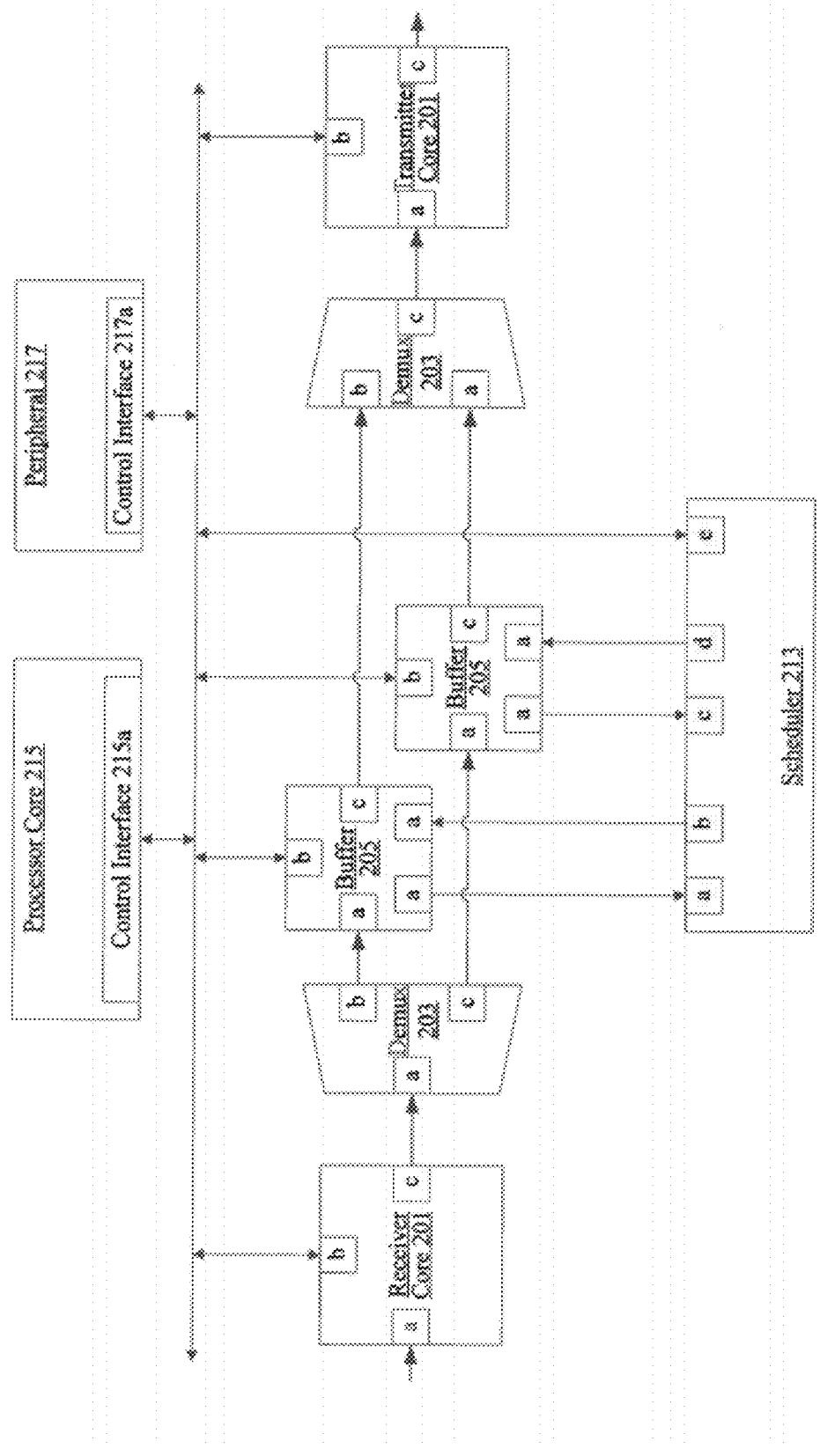
FIG. 2 is a diagrammatic representation showing one example of a programmable chip including components having data interfaces.

FIG. 2 is a diagrammatic representation showing one example of a programmable chip including components having data interfaces. The programmable chip includes a receiver 201. The receiver includes an external interface 201*a*, a control path interface 201*b*, and a data interface 201*c*. The external interface 201*a* is used to communicate with off-chip components. The control interface 201*b* is used to communicate with a processor core 215 through processor core control interface 215*a* and is also used to communicate with a peripheral 217 through peripheral control interface 217*a*. According to various embodiments, the control interface is associated with a Peripheral Components Interface (PCI) bus. In other examples, the control interface is associated with a slave side arbitration fabric or a simultaneous multiple master bus. The receiver data interface 201c is used to carry high throughput, low latency, packet, streaming, or DSP traffic.

In one embodiment, receiver data interface 201c is a 64-bit data interface. The receiver data interface 201c is connected to a demultiplexer 203 through demultiplexer data interface 203a. According to various embodiments the demultiplexer data interface 203a and the receiver data interface 201c are operable to communicate parameter information. In one example, the demultiplexer data interface 203a obtains bit width information from the receiver data interface 201c and automatically configures the demultiplexer data interface 203a to be a 64-bit data interface. The demultiplexer data interface 203a can be self-configured dynamically after implementation of a programmable chip is complete. In other examples, the self-configuration can be performed prior to implementation of a design on a programmable chip. Parameter information can be obtained using dedicated lines or by using existing lines. In some embodiments, parameter information is obtained over control interfaces from a system environment.

The demultiplexer 203 also includes data interfaces 203b and 203c connected to data buffer 205 through data buffer data interface 205a and data buffer 207 through data buffer data interface 207a respectively. Buffers 205 and 207 also include control interfaces 205b and 207b respectively. Credit interfaces 205d and 207d are used to communicate with scheduler 213 through scheduler credit interfaces 213a and 213c. The credit interfaces are used to communicate the availability of data on an associated data interface, or alternatively, the ability of the interface to receive data. An interface that grants credits to indicate the amount of data it has available is referred to herein as a credit producer. A credit interface that reads credits from a credit producer is referred to herein as a credit consumer. Request interfaces 205e and 207e are used to communicate with scheduler 213 through scheduler request interfaces 213b and 213d. The request interfaces are used to request data from an associated data interface. According to various embodiments, credit and request interfaces are control interfaces with defined data formats. The scheduler also has a control interface 213e.

Parameters are used to specify attributes associated with an interface. According to various embodiments, each parameter defines an attribute such as a signal's width, or it defines an attribute of the entire interface such as a read_latency parameter. A parameter can also be used to specify a signal type. A variety of signals and signal characteristics are supported in a variety of transmission environments. According to various embodiments, interfaces are operable to exchange parameter information to allow self-configuration. In one particular example, a single component is configured prior to implementation of a programmable chip and all other components obtain parameter information for self-configuration from the single component.

Figure 3:
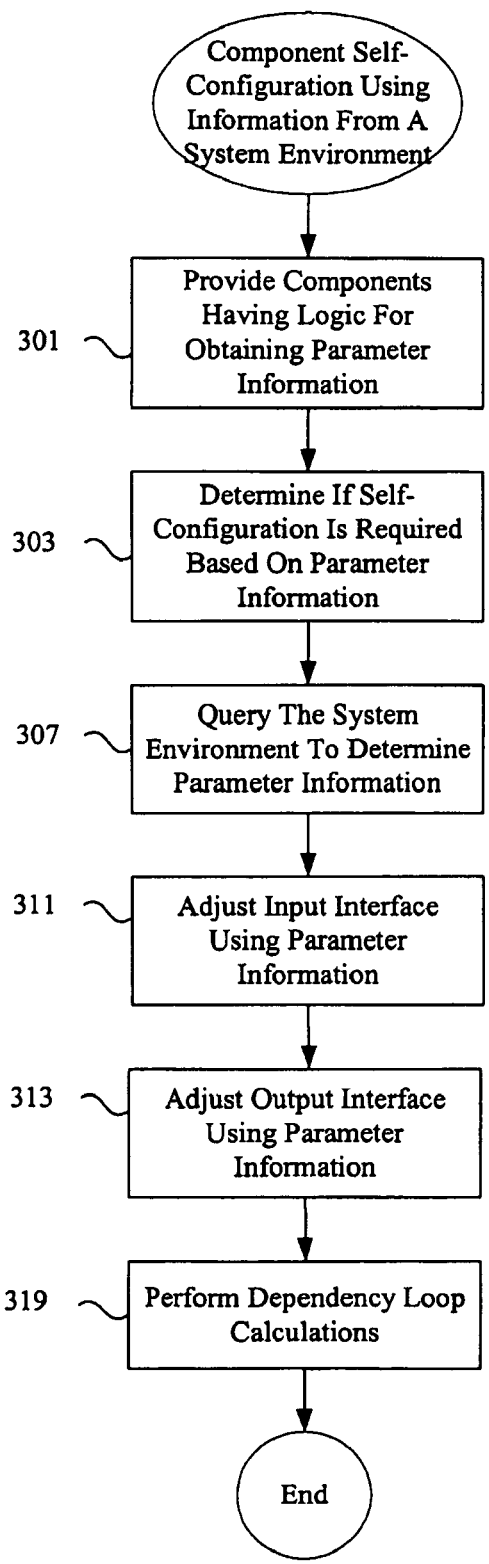
FIG. 3 is a flow process diagram showing one technique for performing component self-configuration.

Components can obtain parameter information from a variety of sources. FIG. 3 is a flow process diagram showing one technique for obtaining parameter information from a system environment. At 301, components having logic for obtaining parameter information from a system are provided. In some examples, components having logic for submitting queries to a system for parameter information are provided. In some embodiments, the logic is provided in a bind program provided with a component from a component library. The bind program is called by a system design tool such as SOPC Builder whenever a relevant attribute or parameter of the system changes. At 303, the bind program looks at its associated component to determine what, if any, self-configuration needs to be performed. Any logic used to query a system to determine parameters associated with adjacent components is referred to herein as a bind program. At 307, a component queries the system to find out the parameters of an adjacent component's output interface.

At 311, the component configures its input interface to match the adjacent component's output interface. At 313, the component configures its output interface using the parameter information. According to various embodiments, configuration using a system environment occurs before a programmable chip is generated. It should be noted that the output interface may not necessarily be the same as the input interface. Parameter information may include bit-width information, burst size, or any information required to communicate with an adjacent component. Errors can be reported if adjustment is not possible. It should be noted that dependency loop detection may be performed in order to ensure that a first component does not depend on a second component that depends on a first component, etc. Dependency loop detection may involve determining the number of times queries have been submitted or received.

Self-configuration of a component using parameter information determined from a system environment such as SOPC Builder information can occur prior to generation of a programmable chip. However, the techniques of the present invention also allow a component to perform self-configuration using parameter information determined from adjacent components before or after generation of a programmable chip. In some instances, a component on a generic nonprogrammable device can perform self-configuration at any time.

Figure 4:
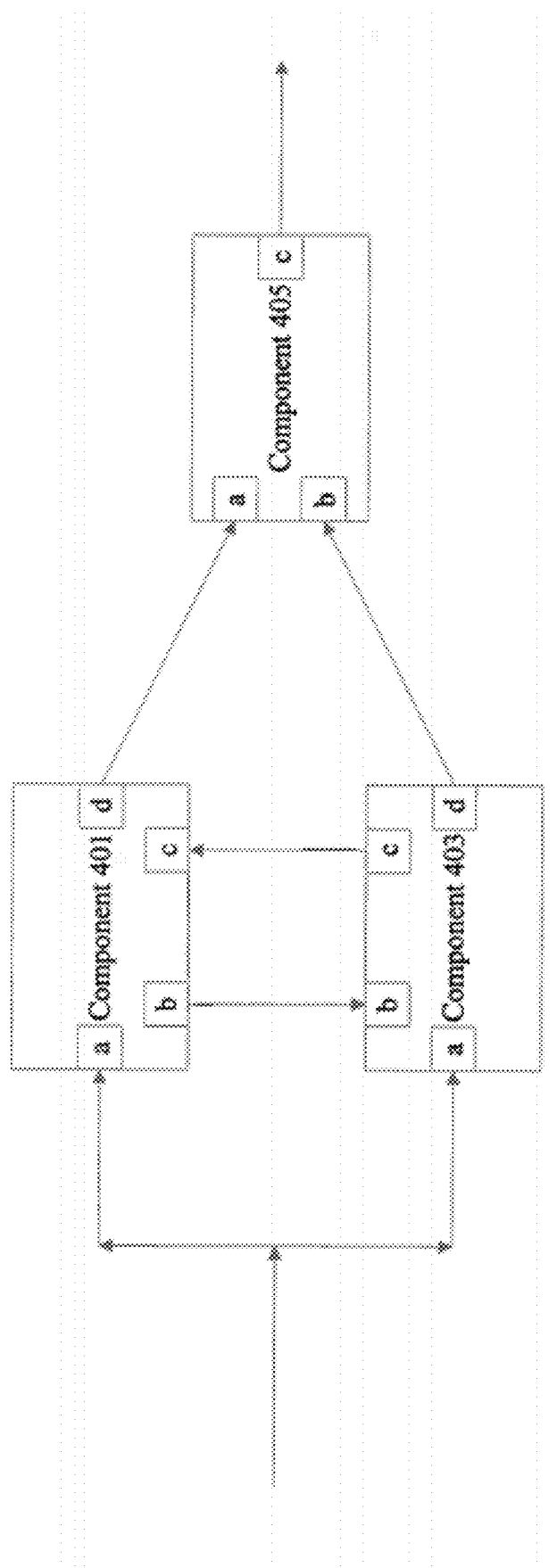
FIG. 4 is a diagrammatic representation depicting self-configuring components.

FIG. 4 is a diagrammatic representation showing one example of a design with components that can obtain parameter information from adjacent components. A component 401 includes input data interface 401a, output data interface 401d, and parameter information interfaces 401b and 401c. A component 403 includes input data interface 403a, output data interface 403d, and parameter information interfaces 403b and 403c. A component 405 includes input data interfaces 405a and 405b as well as output data interface 405d. Components can be a variety of logic blocks such as IP blocks available from an IP block library. In one example, component 401 and component 403 operate in parallel and perform some processing. According to various embodiments, each has a unique latency value and the latency value may change at some point in the future. In some applications, it may be desirable to arrange latency so that the output of both blocks are aligned and the output can be combined and passed onto a component 405.

According to various embodiments, each component 401 and 403 is configured to output its own latency. Component 401 outputs parameter information over interface 401b. Component 403 outputs parameter information over interface 401c. Components 401 and 403 are also configured to determine relative latency, and increase latency as needed to match the other component. In some instances, a decrease may be possible to match the other component.

Figure 5:
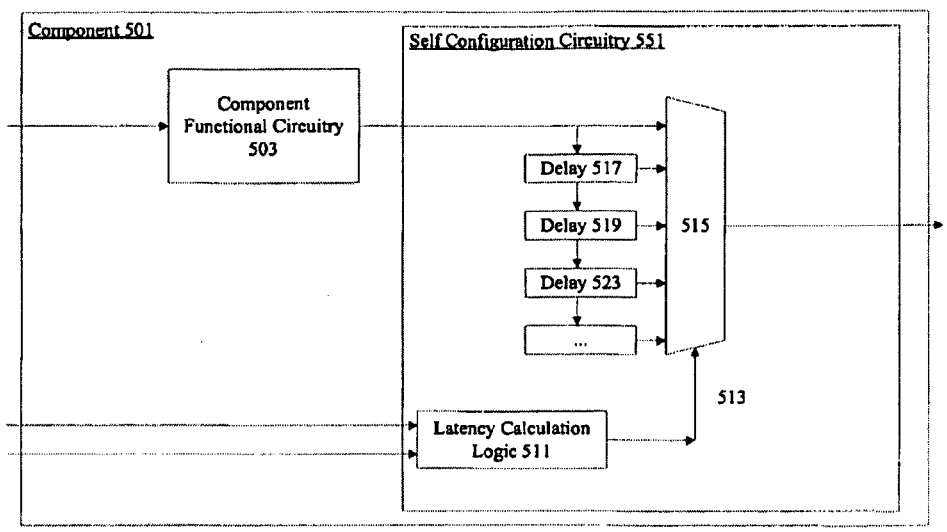
FIG. 5 is a diagrammatic representation showing component circuitry for performing self-configuration.

FIG. 5 is a diagrammatic representation showing one example of configuration circuitry associated with a component. In this particular example, the configuration circuitry is configured to adjust latency of a component. A component 501 exchanges parameter information with an adjacent component. The component 501 includes self-configuration circuitry 551. Using parameter information determined, block 501 compares its own latency to the latency of the adjacent block using latency calculation logic 511. The output of the latency calculation logic 511 is used to control selection of a delay component using multiplexer 515. In one example, component 501 functional block 503 output is not delayed. In other examples, the functional block 503 output is delayed by elements 517, 519, or 523. The delay elements can be selected to match latency of component 501 to the latency of the adjacent component.

Components will automatically adjust latencies to match. If a component is changed or substituted by a different implementation, the system will scale automatically and continue to operate. If latencies can not be tuned effectively, an output pin associated with a component can indicate a general error or display a message during simulation. In this example, latency is described. It should be noted, however, that the technique of the present invention can be used with a variety of different parameters. In another example, bit width information is exchanged. Particular lines can be turned on or off based on exchanged bit width information.

In yet another example, a component can obtain information not only from an adjacent component but from another source such as a processor register or a central parameter store. Register values and a parameter memory can be dynamically changed based on particular user requirements without having to reconfigure a device. This may reduce the need to reprogram a programmable chip or the need to redesign an ASIC. A device configured to operate with a 64-bit data path can be dynamically reconfigured to operate with a 32-bit data path by simply changing register values. Blocks can be reconfigured dynamically.

Figure 6:
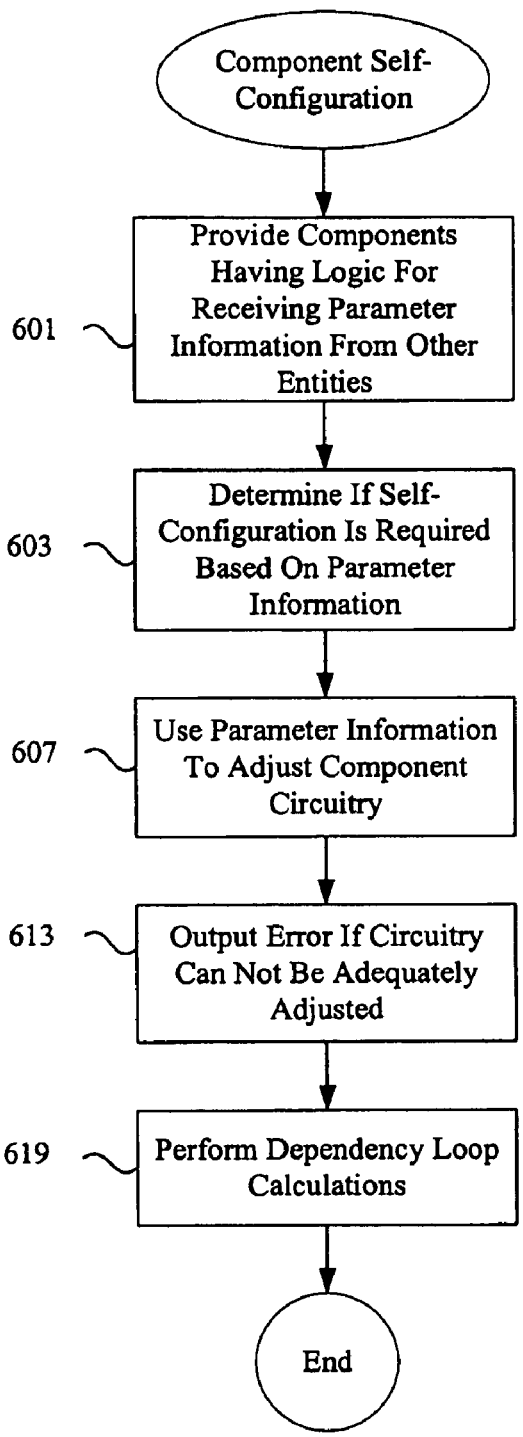
FIG. 6 is a flow process diagram showing another technique for performing component self-configuration.

FIG. 6 is a flow process diagram showing a technique for dynamically reconfiguring a component. At 601, components having logic for receiving parameter information from other entities such as adjacent components, processor registers, or memory are provided. At 603, the components look at parameter information and determine what, if any, self-configuration needs to be performed. At 607, a component uses configuration circuitry to adjust component operation based on the parameter information. If adjustment can not be successfully performed, an error is output at 613. Parameter information may include bit-width information, burst size, or any information required to communicate with an adjacent component. It should be noted that dependency loop detection may be performed at 619 in order to ensure that a first component does not depend on a second component that depends on a first component, etc. Dependency loop detection may involve determining the number of times queries have been submitted or received.

Figure 7:
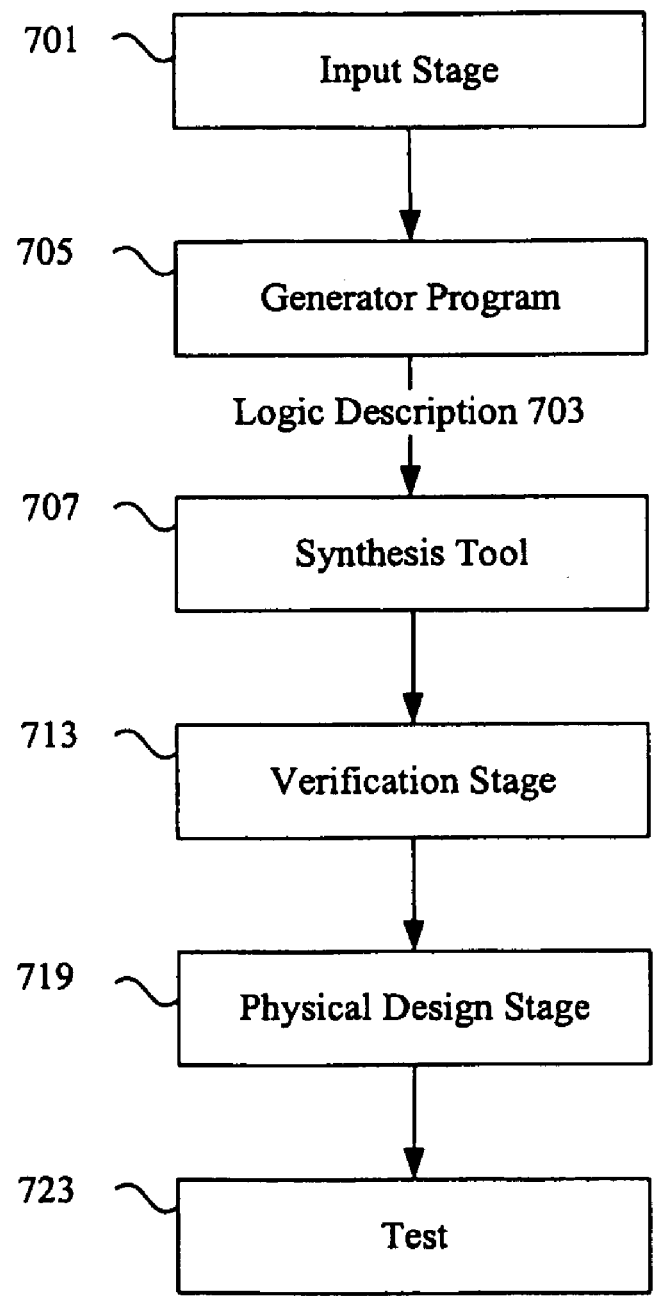
FIG. 7 is a diagrammatic representation depicting implementation of a programmable chip.

FIG. 7 is a diagrammatic representation showing implementation of an electronic device that can use arbitration logic according to various embodiments. An input stage 701 receives selection information typically from a user for logic such as a processor core as well as other components such as a streaming output device to be implemented on an electronic device. In one example, the input received is in the form of a high-level language program. A generator program 705 creates a logic description and provides the logic description along with other customized logic to any of a variety of synthesis tools, place and route programs, and logic configuration tools to allow a logic description to be implemented on an electronic device.

In one example, an input stage 701 often allows selection and parameterization of components to be used on an electronic device. In some examples, components are self-configurable. In some examples, components provided to an input stage include intellectual property functions, mega-functions, and intellectual property cores. The input stage 701 may be a graphical user interface using wizards for allowing efficient or convenient entry of information. Some components may be configured while others obtain parameter information from adjacent components, a system environment, or other sources. The input stage may also be a text interface or a program reading a data file such as a spreadsheet, database table, or schematic to acquire selection information. The input stage 701 produces an output including information about the various modules selected.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 705 identifies pointers and provides ports for each pointer. One tool with generator program capabilities is System on a Programmable Chip (SOPC) Builder available from Altera Corporation of San Jose, Calif. The generator program 705 also provides information to a synthesis tool 707 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 709.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description. Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device.

Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated to by one of skill in the art, a variety of synthesis, place and route, and programmable logic configuration tools can be tested using various techniques of the present invention.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
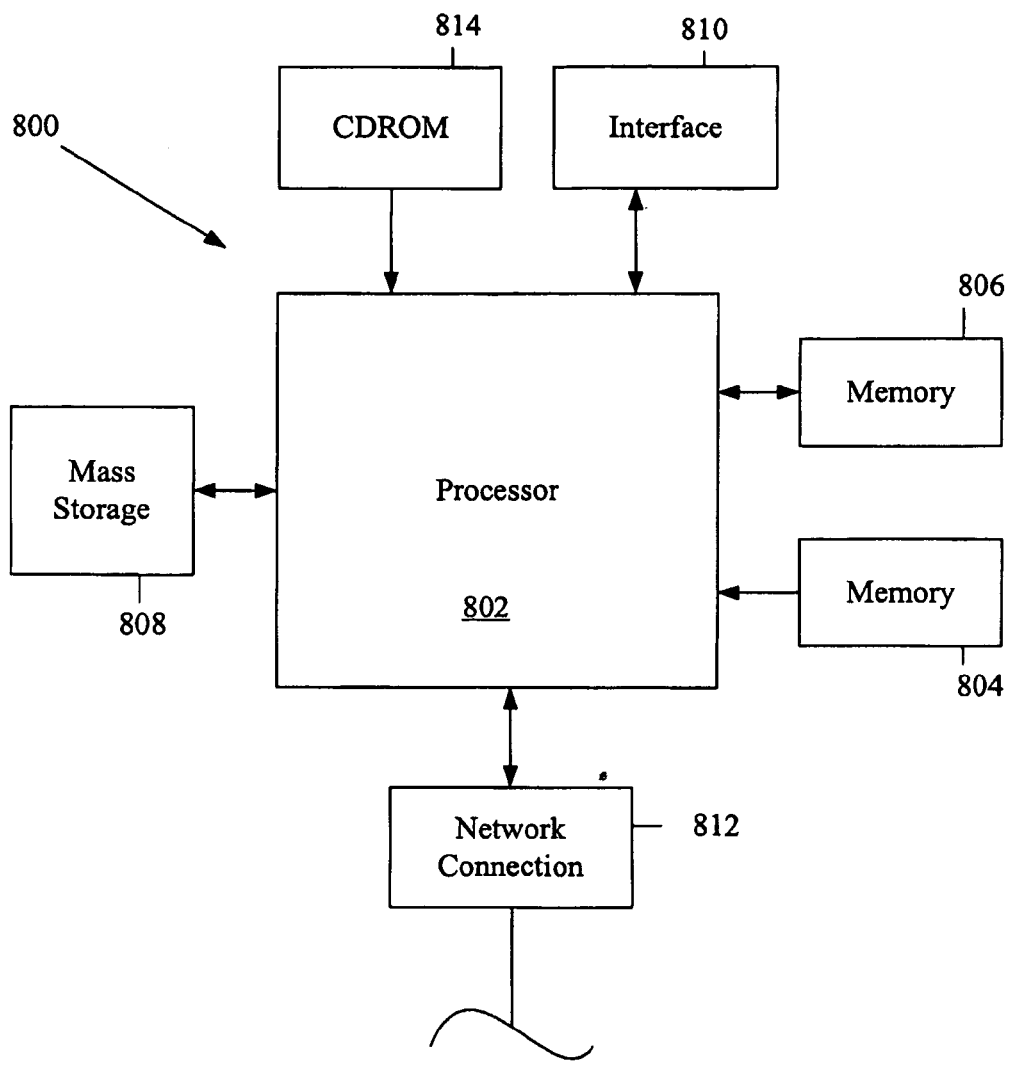
FIG. 8 is a diagrammatic representation showing a computer system.

FIG. 8 is a diagrammatic representation showing a typical computer system that can be used to implement a programmable chip having bus arbitration with priority encoding and fairness. The computer system 800 includes any number of processors 802 (also referred to as central processing units, or CPUs) that are coupled to devices including memory 806 (typically a random access memory, or "RAM"), memory 804 (typically a read only memory, or "ROM"). The processors 802 can be configured to generate a test sequences for any designated processor. As is well known in the art, memory 804 acts to transfer data and instructions uni-directionally to the CPU and memory 806 is used typically to transfer data and instructions in a bi-directional manner.

Both of these memory devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than memory. The mass storage device 808 can be used to hold a library or database of prepackaged logic or intellectual property functions, as well as information on generating particular configurations. It will be appreciated that the information retained within the mass storage device 808, may, in appropriate cases, be incorporated in standard fashion as part of memory 806 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. It should be noted that the system 800 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 808 or 814 and executed on CPU 808 in conjunction with primary memory 806.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. It is therefore intended that the invention be interpreted to include all variations and equivalents that fall within the true spirit and scope of the present invention.

What is claimed is:

1. A method comprising:
    synthesizing an electronic design including a first component and a second component by using a processor, the first component including logic operable to generate a signal to the second component and the second component including logic operable to use the signal to select at least one self-configuration parameter for operating with the first component;
    wherein logic in the first component operable to generate a signal to the second component is removed and logic in the second component operable to use the signal is removed using the processor.

2. The method of claim 1, wherein the signal is static.

3. The method of claim 1 further comprising transmitting a query on a line associated with the first component to obtain the signal.

4. The method of claim 1, wherein the signal is associated with the at least one self-configuration parameter.

5. The method of claim 4, wherein the at least one self-configuration parameter includes bit width or latency.

6. The method of claim 4, wherein the at least one self-configuration parameter includes burst size.

7. The method of claim 1, wherein the electronic design is implemented on a programmable chip.

8. The method of claim 1, wherein the electronic design is implemented on an ASIC.

9. A system comprising:
   an interface operable to receive a first component and a second component, the first component including logic operable to generate a signal to the second component and the second component including logic operable to use the signal to select a self-configuration parameter for operating with the first component; and
   a processor operable to synthesize an electronic design using the first component and the second component, wherein logic in the first component operable to generate a signal to the second component is removed and logic in the second component operable to use the signal is removed using the processor.

10. The system of claim 9, wherein the signal is static.

11. The system of claim 9 further comprising transmitting a query on a line associated with the first component to obtain the signal.

12. The system of claim 9, wherein the signal is associated with the at least one self-configuration parameter.

13. The system of claim 12, wherein the at least one self-configuration parameter includes bit width or latency.

14. The system of claim 12, wherein the at least one self-configuration parameter includes burst size.

15. The system of claim 9, wherein the electronic design is implemented on a programmable chip.

16. The system of claim 9, wherein the electronic design is implemented on an ASIC.

17. A non-transitory computer readable storage medium comprising:
   computer code for synthesizing an electronic design including a first component and a second component by using a processor, the first component including logic operable to generate a signal to the second component and the second component including logic operable to use the signal to select at least one self-configuration parameter for operating with the first component;
   wherein logic in the first component operable to generate a signal to the second component is removed and logic in the second component operable to use the signal is removed using the processor.

* * * * *